(12) United States Patent
Chuang

(10) Patent No.: US 8,216,772 B2
(45) Date of Patent: Jul. 10, 2012

(54) METHOD FOR MANUFACTURING MECHANICAL SHUTTER BLADES USING BERYLLIUM-COPPER ALLOY SUBSTRATE

(75) Inventor: Hsin-Hung Chuang, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 301 days.

(21) Appl. No.: 12/567,874

(22) Filed: Sep. 28, 2009

(65) Prior Publication Data

US 2010/0266963 A1    Oct. 21, 2010

(30) Foreign Application Priority Data

Apr. 20, 2009  (CN) .......................... 2009 1 0301687

(51) Int. Cl.
    *G03F 7/20* (2006.01)
(52) U.S. Cl. ......... 430/320; 430/323; 430/322; 430/329
(58) Field of Classification Search .................. None
    See application file for complete search history.

(56) References Cited

U.S. PATENT DOCUMENTS

| 3,669,865 | A | * | 6/1972 | Semienko et al. | ............ 204/206 |
| 4,733,447 | A | * | 3/1988 | Ageishi | ........................ 29/890.1 |
| 5,242,540 | A | * | 9/1993 | Ishii et al. | ........................ 216/13 |

* cited by examiner

*Primary Examiner* — Daborah Chacko Davis

(74) *Attorney, Agent, or Firm* — Altis Law Group, Inc.

(57) ABSTRACT

An exemplary method for manufacturing mechanical shutter blades using a beryllium-copper substrate is provided. The method includes providing a beryllium-copper alloy substrate having a first surface and a second surface opposite to the first surface; respectively applying a first and second photoresist layers onto the first and second surfaces; exposing and developing the first and second photoresist layers, thereby first portions of the first photoresist layer and second portions of the second photoresist layer are left on the first and second surfaces while an unwanted portion of the substrate is exposed to an exterior, the first portions are aligned with the second portions; removing the unwanted portion of the substrate using a wet etching process; and removing the first and second portions from the remaining portion of the substrate.

8 Claims, 7 Drawing Sheets

METHOD FOR MANUFACTURING MECHANICAL SHUTTER BLADES USING BERYLLIUM-COPPER ALLOY SUBSTRATE

BACKGROUND

1. Technical Field

The present disclosure relates to mechanical shutter, and particularly to a method for manufacturing mechanical shutter blades using a beryllium-copper alloy substrate.

2. Description of Related Art

Mechanical shutters have been used in camera to regulate the amount of light reaching an image sensor of the camera. In general, the mechanical shutters are categorized into leaf type shutter and blade type shutter. The leaf shutter typically consists of an array of blades pivoted with each other so as to pivot towards or away from the lens aperture of the camera. When the shutter is closed, the blades overlap the center of the lens aperture such that no light reaches the image sensor. When the shutter is open, the blades pivot away from the center of the aperture, so that light may pass through the aperture to the image sensor.

Conventional method for manufacturing mechanical shutter blades employs silicon substrates, and the silicon substrate is dry etched with a micro electro mechanical system (MEMS). However, such method is expensive and not cost effective.

What is needed, therefore, is a method for manufacturing mechanical shutter blades to reduce cost.

BRIEF DESCRIPTION OF THE DRAWINGS

Many aspects of the present method for manufacturing mechanical shutter blades using a beryllium-copper alloy substrate can be better understood with reference to the following drawings. The components in the drawings are not necessarily drawn to scale, the emphasis instead being placed upon clearly illustrating the principles of the embodiments of the method. Moreover, in the drawings, all the views are schematic, and like reference numerals designate corresponding parts throughout the different views.

DETAILED DESCRIPTION

A method for manufacturing mechanical shutter blades using a beryllium-copper alloy substrate is illustrated in an exemplary embodiment. The method includes the following steps.

Figure 1:
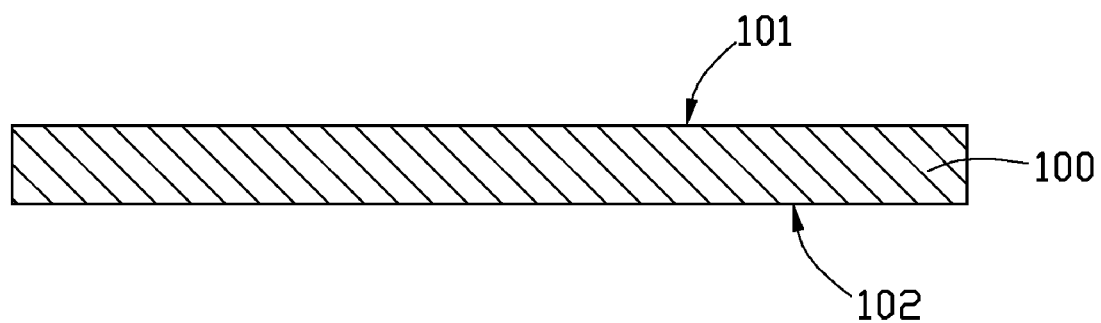
FIG. 1 is a cross-sectional view of a beryllium-copper alloy substrate provided in an exemplary embodiment.

Referring to FIG. 1, a beryllium-copper alloy substrate 100 is provided. The substrate 100 is a plan board shaped, having a first smooth surface 101 and a second smooth surface 102 opposite to the first surface 101. Thickness of the substrate 100 is in a range from 10 micrometers to 100 micrometers. Preferably, the thickness of the substrate 100 is about 50 micrometer.

The substrate 100 is treated with surface processing method. In detail, the first and second surfaces 101, 102 are degreased with an alkaline solution, for example, a sodium hydroxide solution, and then rinsed with water. As such, lipid and contaminations attached on the first and second surfaces 101, 102 are removed. Then, the substrate 100 is dried to evaporate the liquid attached on the substrate 100.

In another illustrated embodiment, the first and second surfaces 101, 102 are unsmooth and the contaminations attached on the first and second surfaces 101, 102 are difficult to be removed by cleaning process. As such, the substrate 100 is smoothened until obtaining smooth surfaces without contaminations. In a further illustrated embodiment, for purpose of improving adhesive force between the photoresist layers employed in the consequent step and the substrate 100, the first and second smooth surfaces 101, 102 are roughened using an etchant.

Figure 2:
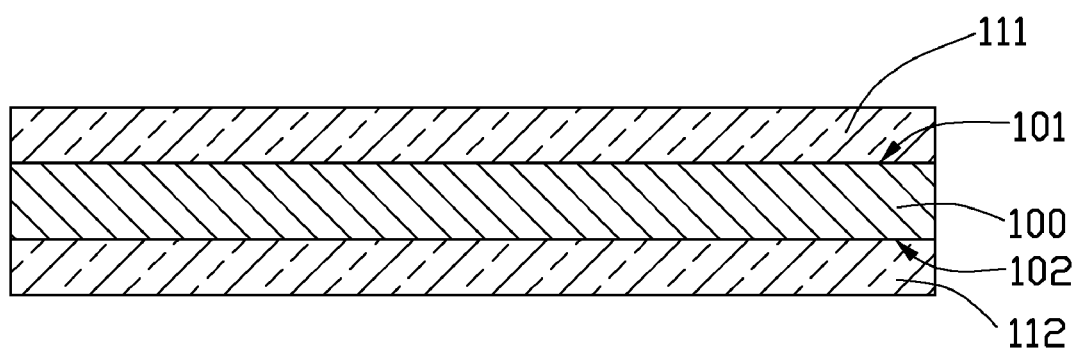
FIG. 2 shows a first and a second photoresist layers respectively applied on two opposite surfaces of the beryllium-copper alloy substrate of FIG. 1.

Referring to FIG. 2, a first and a second photoresist layer 111, 112 are respectively applied onto the first and second surfaces 101, 102 using a coating process. The thicknesses of the first and second photoresist layers 111, 112 are in a range from 5 micrometers to 100 micrometers. In the present embodiment, the photoresist layers 111, 112 are made of liquid positive photoresist, for example, AZ9260. In an alternative embodiment, the photoresist layers 111, 112 are made of liquid negative photoresist.

In another illustrated embodiment, the substrate 100 with the first and second photoresist layers 111, 112 are soft baked about 160 seconds at 110. In this manner, most of solvent contained in the first and second photoresist layers 111, 112 is evaporated, and the first and second photoresist layers 111, 112 are solidified. Hence, adhesive force between the first and second photoresist layers 111, 112 and the substrate 100 is further strengthened.

Figure 3:
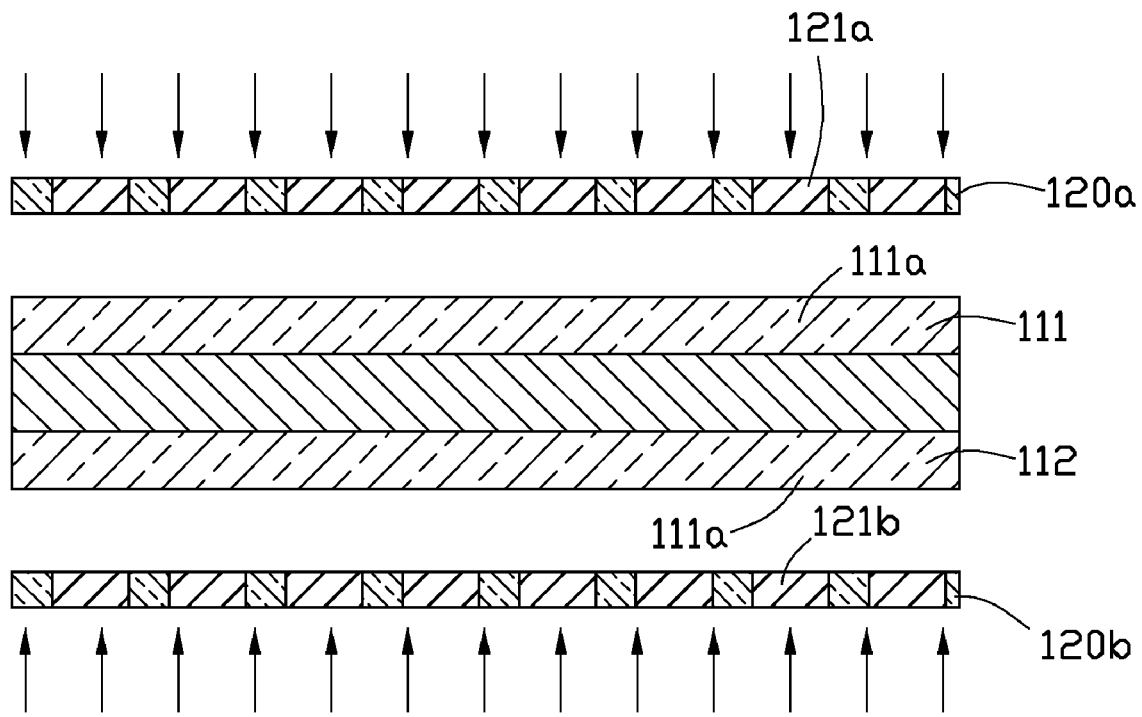
FIG. 3 shows the first and second photoresist layers being exposed under a first and second photo masks.
Figure 4:
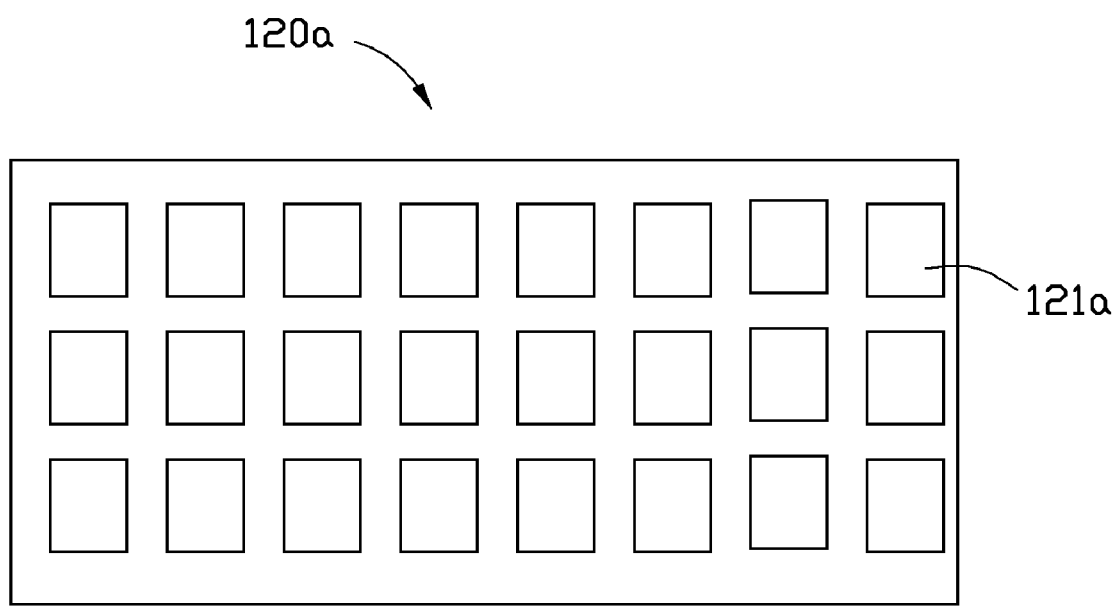
FIG. 4 is a top plan view of the first photo mask of FIG. 3.
Figure 5:
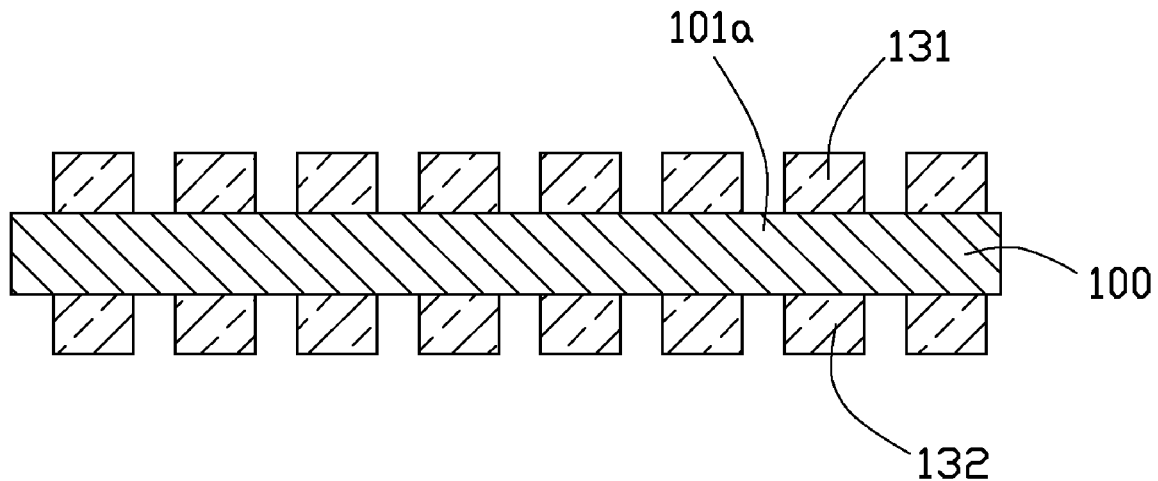
FIG. 5 shows the first and second photoresist layers after being exposed.

Referring to FIG. 3, the first and second photoresist layers 111, 112 are respectively exposed with a first and a second photo mask 120a, 120b. The first and second photo masks 120a, 120b have identical structure. The first and second photo masks 120a, 120b respectively define a plurality of first through holes 121a and second through holes 121b for light beams to pass therethrough. Referring to FIG. 4, taking the first photo mask 120a for example, the first through holes 121a are arranged in three lines and eight rows. Every two neighboring through holes 121a align with each other. Each of the through holes 121a has a pattern and size corresponding to those of shutter blades to be manufactured. The two photo masks 120a, 120b are horizontally over and opposite to the first and second photoresist layers 111, 112 in a manner that each of the first through holes 121a is aligned with a corresponding second through hole 121b. Portions 111a of the first and second photoresist layers 111, 112 are exposed from the first and second though holes 121a, 121b. Referring to FIGS. 3 and 5, when under ultraviolet radiation, the portions 111a are polymerized into first solid portions 131 of the first photoresist layer 111 and second solid portions 132 of the second photoresist layer 112 while the residual portion 101a is dissolvable. The residual portion 101a is removed with a developing agent, for example, AZ400K. As a result, a portion of the substrate 100 is covered by the first portions 131 of the first photoresist layer 111 and the second portions 132 of the second photoresist layer 112 while the residual portions 101a of the substrate 100 are exposed to an exterior.

In another illustrated embodiment, the substrate 100 with the first and second portions 131, 132 are hard baked about 180 seconds at 150° C. In this way, solvent retained in the first and second portions 131, 132 is vaporized. As a result, interface force between the first and second portions 131, 132 and the substrate 100 is further strengthened, so that the first and second portions 131, 132 are protected from corrosion in the consequent wet etching process.

Figure 6:
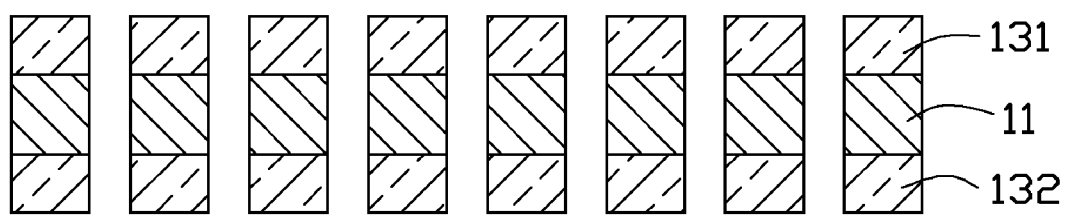
FIG. 6 shows a number of shutter blades, two opposite surfaces of each of the shutter blades are covered by a first portion of the first photoresist layer and a second portion of the second photoresist layer.
Figure 7:
FIG. 7 is cross-sectional view of a shutter blade obtained using the method of the exemplary embodiment.

The substrate 100 is submerged in an etching tank filled with etchant. Referring to FIGS. 5 and 6, the residual portion 101a is etched and removed. Thus, a plurality of shutter blades 11 are obtained. The first and second portions 131, 132 are respectively left on two opposite surfaces of each of the shutter blades 11. In the present embodiment, the etchant is acidified cupric chloride solution, wherein a concentration of cupric chloride is about 100 g/L, and a concentration of acid is about 100 mg/L.

In another illustrated embodiment, for purpose of improving etching efficiency, an ultrasonic device is submerged in the etching tank, and temperature of the etchant is precisely controlled.

The shutter blades 11 with the first and second portions 131, 132 are immersed in an alkali agent. Thereafter, the first and second portions 131, 132 are removed from the remaining portions of the substrate 100, and a plurality of shutter blades 11 are obtained.

In the present embodiment, beryllium-copper alloy substrate 100 is employed for manufacturing shutter blades 11. The substrate 100 is low in price, presenting cost reduction. Furthermore, wet etching process is more convenient for large scale production.

While certain embodiments have been described and exemplified above, various other embodiments will be apparent to those skilled in the art from the foregoing disclosure. The present invention is not limited to the particular embodiments described and exemplified but is capable of considerable variation and modification without departure from the scope and spirit of the appended claims.

What is claimed is:

1. A method for manufacturing mechanical shutter blades, comprising:
   providing a beryllium-copper alloy substrate, the substrate having a first smooth surface and a second smooth surface opposite to the first smooth surface;
   applying a first and a second photoresist layer onto the first and second surfaces respectively;
   exposing and developing the first and second photoresist layers, whereby a plurality of first portions of the first photoresist layer and a plurality of second portions of the second photoresist layer are left on the first and second surfaces and a plurality of unwanted portions of the substrate is exposed to an exterior, and the plurality of first portions are aligned with the respective plurality of second portions, each of the plurality of unwanted portions having a first exposed surface and a second exposed surface opposite to the first exposed surface, the first exposed surface being between two adjacent first portions of the plurality of first portions, and the second exposed surface being between two adjacent second portions of the plurality of second portions;
   etching the unwanted portions of the substrate from the first exposed surfaces to the second exposed surfaces and from the second exposed surfaces to the first exposed surfaces to remove the unwanted portions, thereby obtaining a plurality of remaining portions of the substrate; and
   removing the first and second portions from the remaining portions of the substrate.

2. The method of claim 1, wherein the first and second surfaces are degreased using an alkaline solution and rinsed using water prior to applying the first and second photoresist layers.

3. The method of claim 1, wherein the first and the second surfaces are smoothened prior to applying the first and second photoresist layers.

4. The method of claim 1, wherein the thickness of the substrate is in a range from 10 micrometers to 100 micrometers.

5. The method of claim 1, wherein the thickness of the substrate is about 50 micrometers.

6. The method of claim 1, further comprising soft baking the first and second photoresist layers prior to exposing and developing the first and second photoresist layers.

7. The method of claim 1, further comprising hard baking the first and the second portions prior to the etching of the unwanted portions of the substrate.

8. The method of claim 1, wherein the unwanted portions of the substrate are removed with acidified cupric chloride, a concentration of the cupric chloride is about 100 g/L, and a concentration of the acid is about 100 mg/L.

* * * * *